United States Patent [19]
Kidorf et al.

[11] Patent Number: 6,081,366
[45] Date of Patent: *Jun. 27, 2000

[54] OPTICAL FIBER COMMUNICATION SYSTEM WITH A DISTRIBUTED RAMAN AMPLIFIER AND A REMOTELY PUMPED ER-DOPED FIBER AMPLIFIER

[75] Inventors: Howard David Kidorf, Red Bank; Kenneth Lee Walker, New Providence, both of N.J.

[73] Assignees: Lucent Technologies Inc., Murray Hill; Tyco Submarine Systems, Ltd., Morristown, both of N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/921,984

[22] Filed: Aug. 28, 1997

[51] Int. Cl.$^7$ ........................................................ H01S 3/00
[52] U.S. Cl. .......................................... 359/341; 359/334
[58] Field of Search ..................................... 359/334, 341

[56] References Cited

U.S. PATENT DOCUMENTS

| | | | |
|---|---|---|---|
| 5,117,303 | 5/1992 | Desurvire et al. | 359/341 |
| 5,323,404 | 6/1994 | Grubb | 372/6 |
| 5,659,644 | 8/1997 | DiGiovanni et al. | 385/31 |
| 5,673,280 | 9/1997 | Grubb et al. | 372/3 |
| 5,883,736 | 3/1999 | Oshima et al. | 359/341 |

OTHER PUBLICATIONS

K. Aida et al., *IEE Proceedings*, "Design and Performance of a Long–Span IM/DD Optical Transmission System Using Remotely Pumped Optical Amplifiers", vol. 137, pp. 885–229, Aug. 1990.

H. Masuda et al., *Electronics Letters*, "Ultra–Wideband Optical Amplification with 3dB Bandwidth of 65nm Using a Gain–Equalished Two–Stage Erbium–Doped Fibre Amplifier and Raman Amplification", vol. 33, pp. 753–754, Apr. 24, 1997.

Aida et al., *International Conference on Communications, Denver ICC 91, IEEE*, "Long–Span Repeaterless IM/DD Optical Transmission Experiment Over 300 km Using Optical Amplifier", vol. 3 of 3, pp. 1228–1232, 1991.

"2.488–Gb/s Unrepeatered Transmission over 529 km Using Remotely Pumped Post– and Pre–Amplifiers, Forward Error Correction, and Dispersion Compensation", by P. B. Hansen et al., *OFC 1995*, San Diego, California, Feb. 1995, PD25.

"Optical Amplifiers and Their Applications", by S. G. Grubb et al., Davos, Switzerland, p. 197, Jun. 1995.

Aida, et al., "Design and Performance of a Long–Span IM/DD Optical Transmission System Using Remotely Pumped Optical Amplifier", IEE Proceedings J. Optoelectronics vol. 137, No. 4, Aug. 1, 1990, pp. 225–229.

Masuda, et al., "Ultra–Wideband Optical Amplification with 3 DB Bandwidth of 65 NM Using a Gain–Equalized Two–Stage Erbium–Doped Fire Amplifer and Raman Amplification", Electronics Letter vol. 33, No. 9, Apr. 24, 1997, pp. 753–754.

Aida, et al., "Long–Span Repeaterless IM/DD Optical Transmission Experiment Over 300KM Using Optical Amplifiers", Communications–Rising to the Heights, Denver, Jun. 23–26, 1991, vol. 3, Jun. 23, 1991, pp. 1228–1232.

*Primary Examiner*—Mark Hellner
*Attorney, Agent, or Firm*—Eugen E. Pacher

[57] ABSTRACT

The disclosed optical fiber communication system comprises a remotely pumped erbium-doped fiber amplifier (EDFA). The pump radiation is de-tuned with respect to wavelength, the wavelength being selected longer than both the optimal wavelengths for pumping the EDFA and for producing Raman gain in the transmission fiber, respectively. Such de-tuning results in improved over-all system performance through reduced multi-path interference. Exemplarily, the pump radiation has wavelength in the range 1490–1510 nm.

8 Claims, 4 Drawing Sheets

OPTICAL FIBER COMMUNICATION SYSTEM WITH A DISTRIBUTED RAMAN AMPLIFIER AND A REMOTELY PUMPED ER-DOPED FIBER AMPLIFIER

High power (e.g.,>1 W) pump sources are known. See, for instance, S. G. Grubb et al., "Optical Amplifiers and Their Applications", Davos, Switzerland, p. 197, June 1995.

Despite the advantages provided by the use of high power pump sources in remotely pumped optical fiber communication systems, such use has drawbacks, especially in repeatered systems. For instance, we find that high pump power can result in multi-path interference (MPI) due to large Raman gain and Rayleigh scattering in the transmission medium. Thus, it would be desirable to have available a remotely pumped optical fiber communication system that substantially retains the advantageous characteristics of prior art systems with high pump power, but that is less subject to MPI. This application discloses such systems.

SUMMARY OF THE INVENTION

In a broad aspect the invention is embodied in a remotely pumped optical fiber communication system that is less subject to MPI than analogous prior art systems. Briefly, this is achieved by appropriate selection of the pump wavelength, namely, such that the pump wavelength is longer than the optimal wavelength for pumping the Raman amplifier, and longer than the optimal wavelength for pumping the EDFA, all for a given signal wavelength. The optimal wavelength for pumping the Raman amplifier herein is designated $\lambda_{p,Raman}$, and the optimal wavelength for pumping the EDFA herein designated $\lambda_{p,EDFA}$. By the "optimal" wavelength of pumping an amplifier we mean that wavelength that gives the best combination of characteristics, typically including gain and noise figure.

For conventional signal wavelengths of about 1.55 µm, conventional silica-based transmission fiber and conventional EDFAs, $\lambda_{p,Raman}$ is typically about 1450 nm, and $\lambda_{p,EDFA}$ is typically about 1480 nm.

The design philosophy of remotely pumped fiber communication systems according to the invention involves selection of the pump such that the pump wavelength is not optimal for either the EDFA or the Raman amplifier, but yields improved over-all results through reduced MPI.

More specifically, the invention is embodied in an optical fiber communication system (typically a multi-wavelength system) that comprises a transmitter, a receiver, a transmission link that signal-transmissively connects the transmitter and the receiver and comprises at least one EDFA, and a source of pump radiation of wavelength $\lambda_p$ less than a signal radiation wavelength $\lambda_s$. The source of pump radiation is spaced from the EDFA, with the pump radiation being transmitted to the EDFA through at least a portion of the transmission link that comprises silica-based single mode optical fiber selected to provide Raman gain at $\lambda_s$. Significantly, $\lambda_p$ is selected to be longer than $\lambda_{p,Raman}$, an optimal wavelength for producing said Raman gain, and also longer than $\lambda_{p,EDFA}$, an optimal wavelength for pumping the EDFA, with $\lambda_p$ selected to result in reduced multi-path interference. For conventional signal wavelengths of about 1.55 µm, $\lambda_p$ typically is in the approximate range 1490–1510 nm.

DETAILED DESCRIPTION

Figure 1:
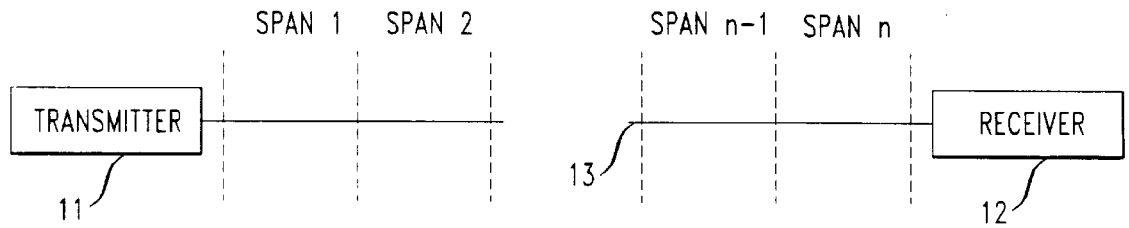
FIG. 1 schematically depicts a multi-span remotely pumped optical fiber communication system.

FIG. 1 schematically depicts a multi-span optical fiber communication system 10, wherein reference numerals 11–13 designate the transmitter, receiver, and optical fiber transmission path that connects transmitter and receiver. The system will typically be a multi-wavelength system having closely spaced (e.g., 1 nm spacing) signal channels. Thus, transmitter 11 actually comprises a multiplicity of transmitters with associated known components, e.g., isolators, polarization controllers, modulators and multiplexers. It typically will also comprise a power amplifier, e.g., an EDFA. Analogously, receiver 12 will typically comprise a multiplicity of receivers, with demultiplexing means for separating the signal channels.

Figure 2:
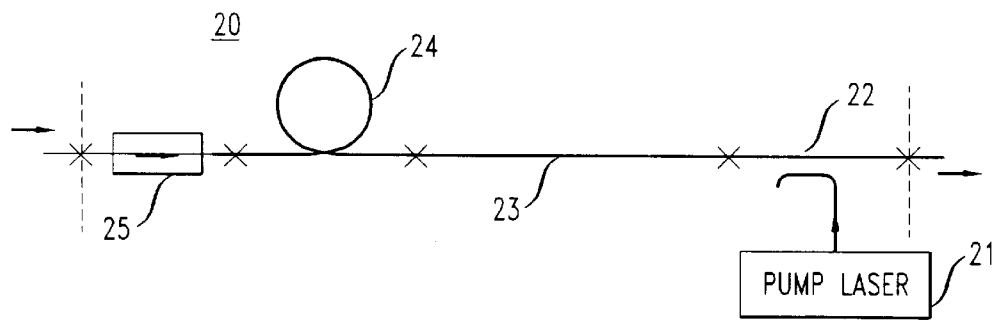
FIG. 2 shows schematically one span of a communication system of the type shown in FIG. 1.

The optical fiber transmission path comprises one or more repeater spans, indicated by broken vertical lines. In multi-span paths the spans will generally be substantially identical. An exemplary span 20 is schematically shown in FIG. 2, wherein reference numerals 21–22 refer, respectively, to the pump laser, and to a conventional directional coupler (frequently referred to as "WDM") that serves to couple the pump radiation into the transmission path, optionally such that the pump radiation propagates in opposite direction to the signal radiation. Numerals 23–25 refer, respectively, to the transmission fiber, Er-doped fiber, and an optional optical isolator. The "x" symbols indicate fiber splices, as is conventional.

The pump laser is a high power laser, exemplarily comprising a dual-clad fiber pumped by an array of 915 nm laser diodes, with the output of the dual-clad fiber converted to the desired wavelength through cascaded Raman lasers. See, for instance, the above cited paper by S. G. Grubb et al. Pump lasers of this type are commercially available and are capable of providing more than 1 W of optical power at a desired wavelength in the approximate range 1450–1500 nm.

The transmission fiber 23 in FIG. 2 can be conventional Ge-doped silica-based fiber, exemplarily commercially available dispersion-shifted fiber with dispersion zero at about 1580 nm. By way of example, the length of the transmission fiber is of order 100 km.

When pumped by means of the pump laser in known manner, Er-doped fiber 24 acts as optical amplifier for signal radiation of approximate wavelength 1.55 µm. The direction of signal propagation is indicated by arrows in FIG. 2. As is known, in the presence of pump radiation of appropriate wavelength, signal radiation in the transmission fiber can experience gain due to stimulated Raman scattering (SRS). Thus, span 20 contains two gain elements, namely, EDFA 24 and a distributed Raman amplifier in the transmission fiber 23. For the exemplary configuration shown in FIG. 2, EDFA 24 is a remotely pumped amplifier.

Figure 3:
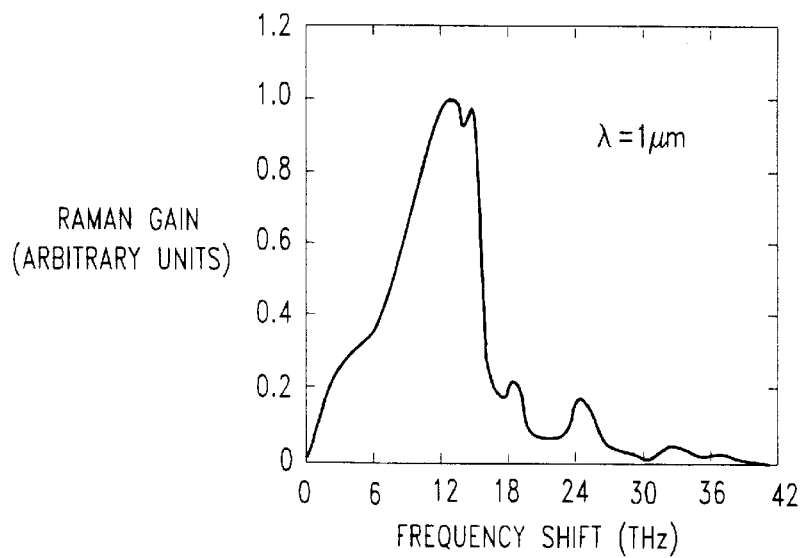
FIG. 3 shows Raman gain as a function of frequency shift.

FIG. 3 shows the Raman gain spectrum of a typical Ge-doped silica fiber. As can be seen, the gain has a pronounced maximum for a wavelength difference between signal and pump that corresponds to a frequently shift of about 13 THz. For signal radiation of 1550 nm, pump radiation of about 1450 nm wavelength provides maximum Raman gain.

By definition, a remotely pumped optical fiber communication system comprises a conventional erbium-doped fiber amplifier and a distributed Raman amplifier disposed between the pump source and said fiber amplifier, with conventional silica-based transmission fiber providing the Raman gain medium.

As stated above, conventional EDFAs typically perform optimally if pumped with 1480 nm radiation.

We have discovered that significant performance improvements can be obtained if the wavelength in a remotely pumped system is selected to be greater than the wavelengths which result in optimal performance for the EDFA or for a Raman amplifier. More specifically, by selecting the pump radiation source such that $\lambda_p \geq 1490$ nm, it is possible to reduce deleterious MPI and thereby obtain improved overall performance. This is especially the case for multi-stage remotely pumped optical fiber communication systems such as undersea systems of length $\geq 1000$ km.

By way of example, for a signal of wavelength 1558 nm, maximum Raman gain in a given conventional Ge-doped silica-based transmission fiber is obtained with a pump wavelength of about 1458 nm. Conventional Er-doped amplifier fiber has optimal performance if pumped at 1480 nm. Thus, pump radiation of wavelength 1490 nm differs substantially from the optimal pump wavelengths for either an EDFA or a Raman amplifier, respectively. However, use of 1490 nm pump radiation can result in improved performance of a remotely pumped optical fiber communication system due, at least in part, to reduced MPI.

Figure 4:
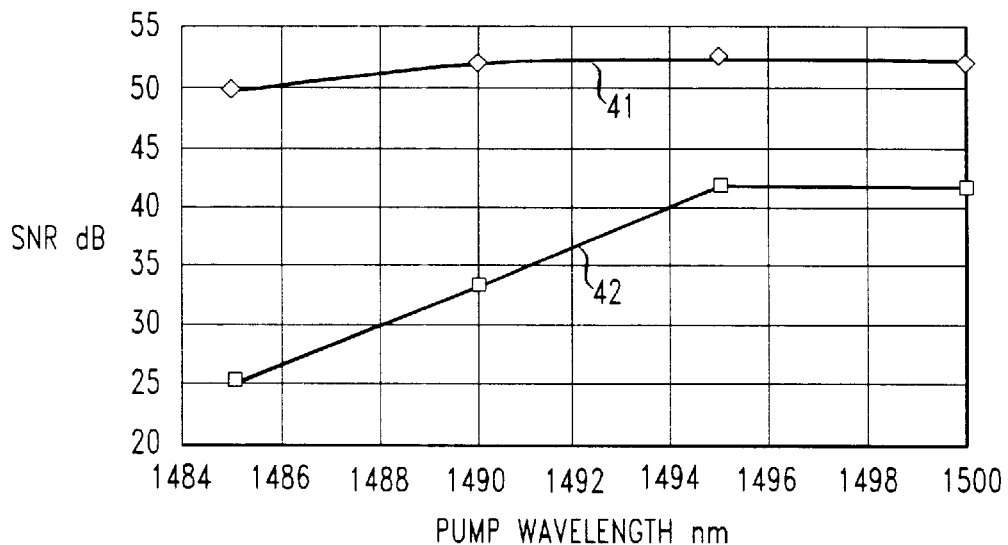
FIG. 4 shows exemplary data on signal to noise ratio as a function of pump wavelength, for $\lambda_s$=1558 nm.

FIG. 4 illustrates the above discussion. The data of FIG. 4 pertains to the combined Raman and erbium-doped amplifiers in an exemplary remotely pumped optical fiber communication system with 22 identical stages, the stages being similar to those described below. The figure shows signal to noise ratio as a function of pump wavelength (pump power 1.1 watt), for two contributing noise mechanisms, namely, amplified spontaneous emission or ASE (curve 41) and MPI (curve 42). As can be seen from the figure, the noise due to ASE is relatively independent of pump wavelength, but the signal to noise ratio due to MPI increases strongly with increasing pump wavelength, at least up to about 1490 nm. FIG. 4 thus clearly demonstrates a benefit that results from detuning of the pump wavelength, as described above. At higher pump powers even longer pump wavelengths can yield improved performance.

Figure 5:
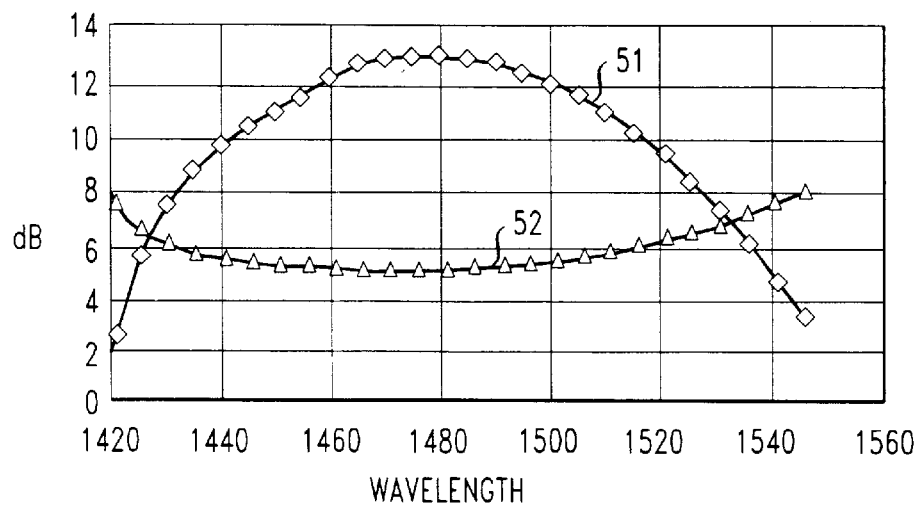
FIG. 5 shows data on gain and noise figure as a function of wavelength, for an exemplary EDFA.

FIG. 5 shows gain (curve 51) and noise figure (curve 52) as a function of pump wavelength for an exemplary EDFA (length 22 meters, pump power 10 mW, signal power −6 dBm). As can be seen, the gain and noise figure vary relatively slowly as a function of pump wavelength, facilitating design of "detuned" remotely pumped optical fiber communication systems according to the invention.

Figure 6:
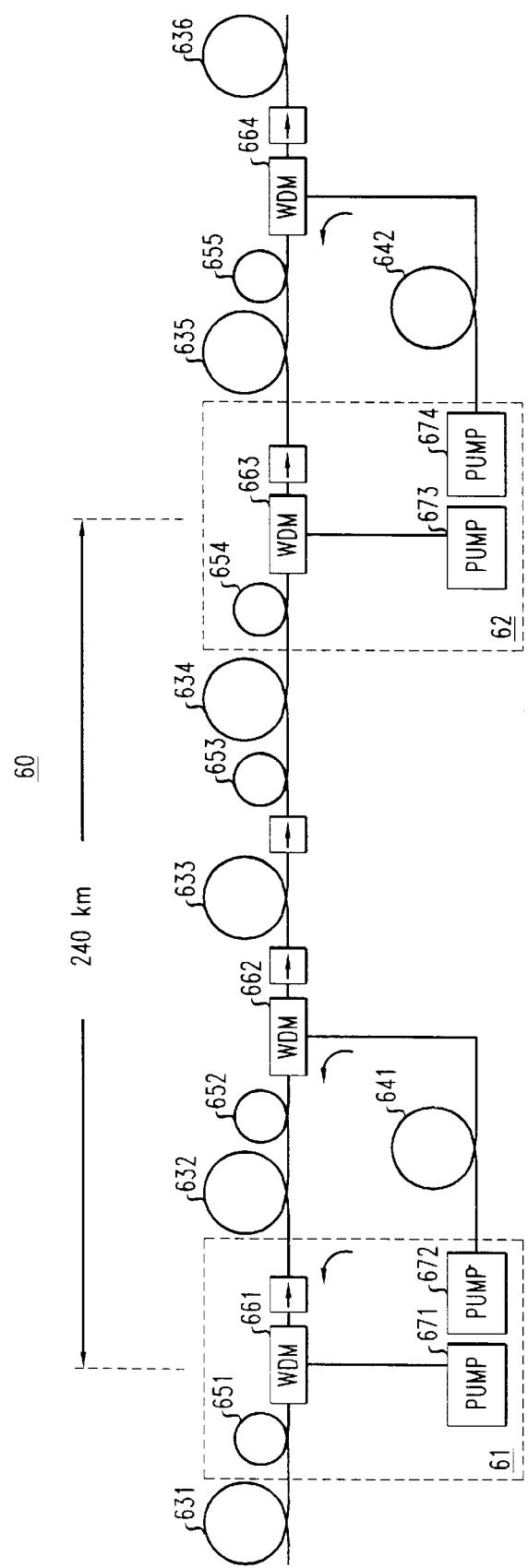
FIG. 6 schematically shows a portion of an exemplary multi-stage remotely pumped optical fiber communication system.

FIG. 6 schematically depicts one stage 60 in a further exemplary remotely pumped system. The system was implemented in a test bed, simulating transmission over 5280 km with 8 channels, each at 2.5 Gbit/s. Each repeater span was 240 km long. The system achieved a performance comparable to that of a similar system using conventional locally pumped EDFAs with 80 km repeater span, thereby demonstrating the saving in repeater cost and improvement in reliability that are attainable with remotely pumped systems.

In FIG. 6, numerals 61 and 62 refer to a first and an adjacent second repeater, respectively. Numerals 631–636 each refer to 80 km of transmission fiber, the transmission fiber being commercially available dispersion shifted fiber, with appropriate lengths of dispersion compensating fiber added. This is not shown in the figure. Numerals 641 and 642 each refer to 80 km of low loss, pure silica-core transmission fiber, used to provide pump power to remotely located EDFAs 652 and 655. Numerals 651–655 refer to Er-doped fiber, numerals 661–664 refer to WDMs, and numerals 671–674 refer to pump lasers. FIG. 6 also shows several optical isolators, but does not show splices.

Pump radiation (1485 nm) from pump source 672 remotely pumps EDFA 652 through 80 km of low loss, pure silica-core fiber 641 and WDM 662. Pump radiation (1495 nm) from pump 673 (corresponding to pump 671 in repeater 61) is provided to EDFAs 654 and 653, with 80 km of transmission fiber 635 between the EDFAs. The transmission fiber provides Raman gain to the signal radiation that propagates in the direction from repeater 61 to repeater 62.

The transmission fiber consisted of dispersion-shifted fiber with zero dispersion wavelength at about 1580 nm and about −2 ps/nm km chromatic dispersion at the signal wavelength. Accumulated dispersion was compensated every 480 km with conventional single mode fiber with chromatic dispersion of about 17 ps/nm km. Additional dispersion compensation was provided at the receiver (not shown). Gain equalization was provided every 480 km (not shown). Three conventional isolators in each span served to reduce MPI caused by double Rayleigh reflections.

The pump lasers were formed by pumping a dual clad fiber with 915 nm radiation from a laser diode array such that pump radiation of a desired wavelength was formed in known manner. Each pump source was capable of launching about 1.2 W of optical power into a single mode fiber.

Figure 7:
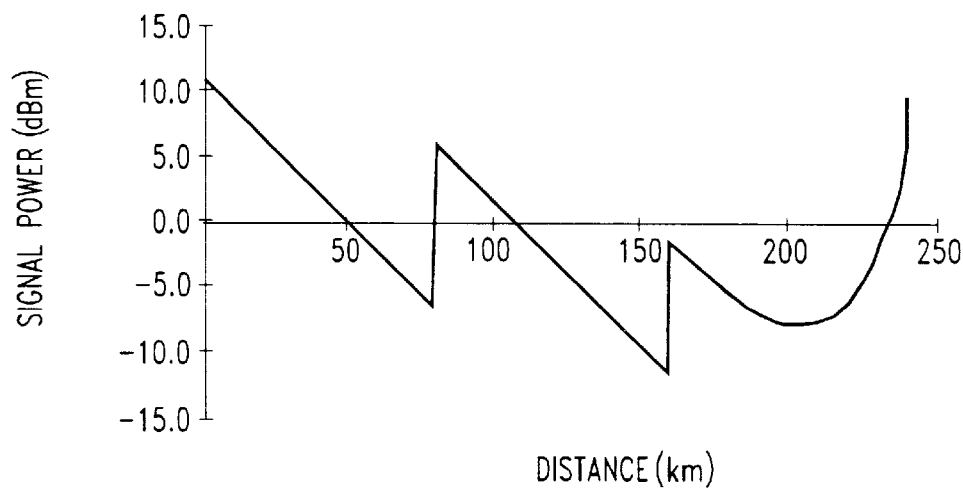
FIG. 7 shows signal power vs. distance for the system of FIG. 6.

FIG. 7 shows the signal power evolution during transmission through one span, starting at EDFA 651 and ending with the Raman amplification in transmission fiber 635.

Figure 8:
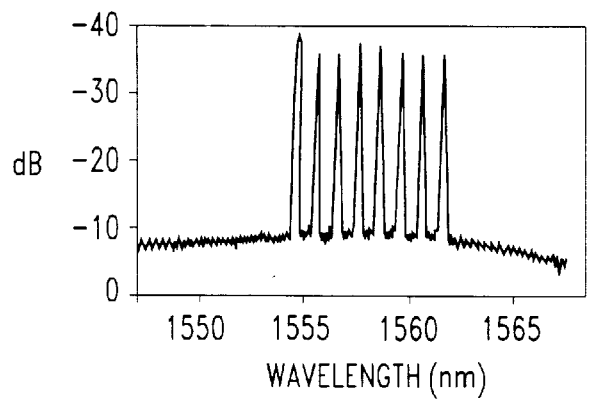
FIGS. 8 and 9 show the transmitted and received power spectrum for the system of FIG. 6.
Figure 9:
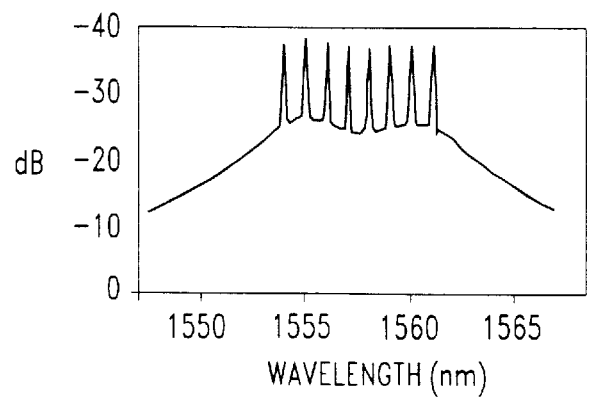

FIG. 8 shows the transmitted power spectrum, and FIG. 9 shows the received spectrum, after 5280 km transmission. At the receiver, the signal to noise ratio was approximately 11 dB.

The above described remotely pumped exemplary optical fiber system comprises features that serve to reduce MPI. However, MPI was still present to some degree. It can be further reduced in a communication system according to the invention, with the pump radiation further detuned from the wavelength of maximum Raman gain, as described above.

What is claimed is:

1. An optical fiber communication system comprising a transmitter, a receiver, an optical fiber transmission link that signal-transmissively connects the transmitter and the receiver and comprises at least one erbium-doped optical fiber amplifier, and a source of pump radiation of wavelength $\lambda_p$ less than a signal wavelength $\lambda_s$, said source of pump radiation being spaced from said erbium-doped optical fiber amplifier, with the pump radiation being transmitted to the erbium-doped optical fiber amplifier through at least a portion of said optical fiber transmission link that comprises silica-based single mode optical fiber selected to provide Raman gain at the signal wavelength;

CHARACTERIZED IN THAT $\lambda_p$ is selected to be longer than an optimal wavelength $\lambda_{p,Raman}$ for producing said Raman gain, and also to be longer than an optimal wavelength $\lambda_{p,EDFA}$ for pumping the Er-doped optical fiber amplifier, with $\lambda_p$ selected to result in reduced multi-path interference.

2. System according to claim 1, wherein $\lambda_p$ is in the range 1490–1510 nm.

3. System according to claim 1, wherein said optical fiber transmission link comprises a multiplicity of substantially identical repeater spans.

4. System according to claim 3, wherein a given one of said repeater spans is more than 100 km long.

5. System according to claim 4, wherein the source of pump radiation of the given repeater span is a diode-pumped fiber laser.

6. System according to claim 5, wherein $\lambda_p$ is in the range 1490–1510 nm.

7. A method for providing optical pump power to an optical fiber communication system having a rare-earth doped optical fiber amplifier and a Raman amplifier such that a given level of multipath interference (MPI) is produced when said amplifiers are pumped at a first wavelength that is less than a signal wavelength, said method comprising the steps of:

selecting a pump wavelength greater than said first wavelength;

remotely pumping said rare-earth doped optical fiber amplifier and said Raman amplifier at said pump wavelength so that MPI is produced at a level below said given level of MPI.

8. The method of claim 7 wherein said pump wavelength is less than said signal wavelength.

* * * * *